(12) United States Patent
Khoh et al.

(10) Patent No.: US 7,313,780 B2
(45) Date of Patent: Dec. 25, 2007

(54) SYSTEM AND METHOD FOR DESIGNING SEMICONDUCTOR PHOTOMASKS

(75) Inventors: Andrew Khoh, Singapore (SG); Byong-Il Choi, Singapore (SG); Lap Chan, Singapore (SG); Ganesh Samudra, Singapore (SG); Yihong Wu, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 63 days.

(21) Appl. No.: 11/078,820

(22) Filed: Mar. 10, 2005

(65) Prior Publication Data

US 2006/0206852 A1      Sep. 14, 2006

(51) Int. Cl.
    *G06F 17/50* (2006.01)
(52) U.S. Cl. ....................................................... 716/19
(58) Field of Classification Search ............. 716/19–21
    See application file for complete search history.

(56) References Cited

U.S. PATENT DOCUMENTS

| | | | | |
|---|---|---|---|---|
| 5,633,713 | A * | 5/1997 | Tanaka et al. ............... | 356/521 |
| 6,243,855 | B1 | 6/2001 | Kobayashi et al. | |
| 6,546,543 | B1 * | 4/2003 | Manabe et al. ............... | 716/21 |
| 6,665,856 | B1 | 12/2003 | Pierrat et al. | |
| 7,060,395 | B2 * | 6/2006 | Misaka .......................... | 430/5 |
| 7,147,975 | B2 * | 12/2006 | Misaka .......................... | 430/5 |
| 2002/0074480 | A1 * | 6/2002 | Wasserman ................ | 250/205 |
| 2003/0140330 | A1 * | 7/2003 | Tanaka et al. ................ | 716/19 |
| 2004/0073884 | A1 * | 4/2004 | Kroyan ......................... | 716/19 |
| 2004/0095611 | A1 * | 5/2004 | Watanabe et al. .......... | 358/3.26 |
| 2004/0111693 | A1 * | 6/2004 | Lin et al. ...................... | 716/19 |
| 2005/0055658 | A1 * | 3/2005 | Mukherjee et al. ........... | 716/19 |
| 2005/0081179 | A1 * | 4/2005 | Melvin, III .................. | 716/20 |
| 2005/0158634 | A1 * | 7/2005 | Thony et al. .................. | 430/5 |
| 2006/0121366 | A1 * | 6/2006 | Misaka .......................... | 430/5 |

OTHER PUBLICATIONS

Andrew Khoh, Donis Flagello, Tom Milster, Byoung-Il Choi, Ganest S. Samudra, Yihong Wu, "Extending a GTD-based image formation technique to EUV Lithography", Emerging Lithographic Technologies VII, *Proceedings of SPIE*, pp. 282-689 vol. 5037 (2003).

Andrew Khoh, Tom Milster, Byoung-Il Choi, Ganesh S. Samudra, Yihong Wu, "Influence of OPC features on the profile of 2D mask patterns", Optical Microlithography XV, *Proceedings of SPIE*, pp. 1127-1138, vol. 4691, Jul. 2002.

Jessica Cuomo, Nkiruka Nwasokwa, Vadim Ponomarenko, "Jump Systems and Laminated Manhattan Sets", Australasian Journal of Combinatorics, vol. 31, pp. 135-144, Feb. 2005.

(Continued)

*Primary Examiner*—Jack Chiang
*Assistant Examiner*—Suchin Parihar
(74) *Attorney, Agent, or Firm*—Mikio Ishimaru

(57) ABSTRACT

A trial semiconductor photomask design having discontinuity points is provided, and each of the discontinuity points is treated as simulated light sources. Simulated light from each of the simulated light sources is focused, and a composite image intensity of the focused simulated light is calculated to verify the trial semiconductor photomask design. The trial semiconductor photomask design is sharpened. A photomask design specification is generated for use in fabricating such a photomask.

20 Claims, 7 Drawing Sheets

OTHER PUBLICATIONS

Konstantinos Adam, Andrew R. Neureuther, "Simplified Models for Edge Transitions in Rigorous Mask Modeling", Optical Microlithography XIV, *Proceedings of SPIE,* pp. 331-344, vol. 4346 (2001).

Nicolas B. Cobb, Yuri Granik, "Model-based OPC using the MEEF matrix", 22nd Annual BACUS Symposium on Photomask Technology, *Proceedings of SPIE,* Abstract, (pp. 1281-1292), vol. 4889, Dec. 2002.

Andrew Khoh, Byoung-Il Choi, "Variable-Length OPC Methodology", pp. 1-5, presented at Optical Microlithography XVII Conference, Feb. 24, 2004, Santa Clara, CA.

Andrew Khoh, Ganest S. Samudra, Yihong Wu, Tom Milster, Byoung-Il Choi, "Image formation by use of the geometrical theory of diffraction", *Journal of the Optical Society of America A.,* vol. 21, No. 6, pp. 959-967, Jun. 2004.

\* cited by examiner ined detail in order to not unnecessarily obscure the present invention.

SYSTEM AND METHOD FOR DESIGNING SEMICONDUCTOR PHOTOMASKS

TECHNICAL FIELD

The present invention relates generally to photolithography and more particularly to designing photomasks.

BACKGROUND ART

Integrated circuits are now used in almost every type of electronic product ranging from toys to massive computers. These integrated circuits are all generally made by a photolithographic process, which involves manufacturing a template containing patterns of the electrical circuit as transparent and opaque areas. The patterned template is referred to as a "reticle" or "mask".

A radiation source, such as a light, is used to copy or "pattern" multiple images of the mask onto a photosensitive material, such as a photoresist, on the surface of a silicon wafer. Once features are patterned on the photoresist, further processing is performed to form various structures on the silicon wafer. The completed wafer is then cut (or "diced") to form the individual integrated circuits.

In conventional industry practice, the masks are fabricated starting from an initial mask blank, which is transparent to the imaging light. Typically, the mask blank consists of fused silica or quartz. The mask blank is coated by an opaque film, typically a chromium based material. The opaque film is also processed using another mask and a photoresist to create openings in the opaque film to expose and permit light to pass through the openings and through the transparent quartz.

Unfortunately, small distortions can occur during patterning. These small distortions are caused by optical interference between elements of the mask design, optical diffraction, and resist process effects. Optical proximity correction ("OPC") corrects these small distortions.

OPC is a mask design enhancing procedure that corrects small distortions that occur during patterning. These small distortions are caused by optical interference between elements of the mask design, optical diffraction, and resist process effects. By applying modifications to compensate for the distortions, optical proximity correction produces slight shape changes in the semiconductor design. For example, if interference will cause a patterned line to be too short or too narrow, OPC will modify the designed line to be slightly longer or wider.

Engineers typically use computer aided design ("CAD") to create a schematic design of the mask. In order to predict the image the mask will create on a photoresist, computer simulations of photoresist patterning are run during the OPC process.

A computer simulation involves lengthy computations and, especially with complicated mask designs, takes a long time to complete. After the simulation is complete, appropriate changes are made to the mask design, and another lengthy simulation is run. This process is repeated until a penultimate mask design generates a desired photoresist image. OPC also sharpens the design, leading to the final mask design.

However, sharpening of the design relies on proper fragmenting of the mask design. If the fragmenting is incorrect, the final mask design will be under-corrected or over-corrected. If this occurs, the OPC process must be run again and new fragmenting applied to the mask design.

Unfortunately, the CAD procedures are lengthy, requiring days to complete. In the modern marketplace, where advancements occur daily, such delays can cause significant loss of market share and revenue.

Solutions to these problems have been long sought but prior developments have not taught or suggested any solutions and, thus, solutions to these problems have long eluded those skilled in the art.

DISCLOSURE OF THE INVENTION

The present invention provides a method for designing semiconductor photomasks. A trial semiconductor photomask design having discontinuity points is provided, and each of the discontinuity points is treated as simulated light sources. Simulated light from each of the simulated light sources is focused, and a composite image intensity of the focused simulated light is calculated to verify the trial semiconductor photomask design. The trial semiconductor photomask design is sharpened. A photomask design specification is generated for use in fabricating such a photomask.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings are semi-diagrammatic and not to scale and, particularly, some of the dimensions are for the clarity of presentation and are shown exaggerated in the Figures.

The term "horizontal" as used herein is defined as a plane parallel to the conventional plane or surface of the semiconductor wafer or die, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

The present system is described with respect to wavelengths in the ultra-violet range. However, it will be readily understood that the invention is applicable to any wavelength of radiation, and the modifications for other wavelengths will be obvious to those of ordinary skill in the art based on the description of the present invention provided herein.

Figure 1:
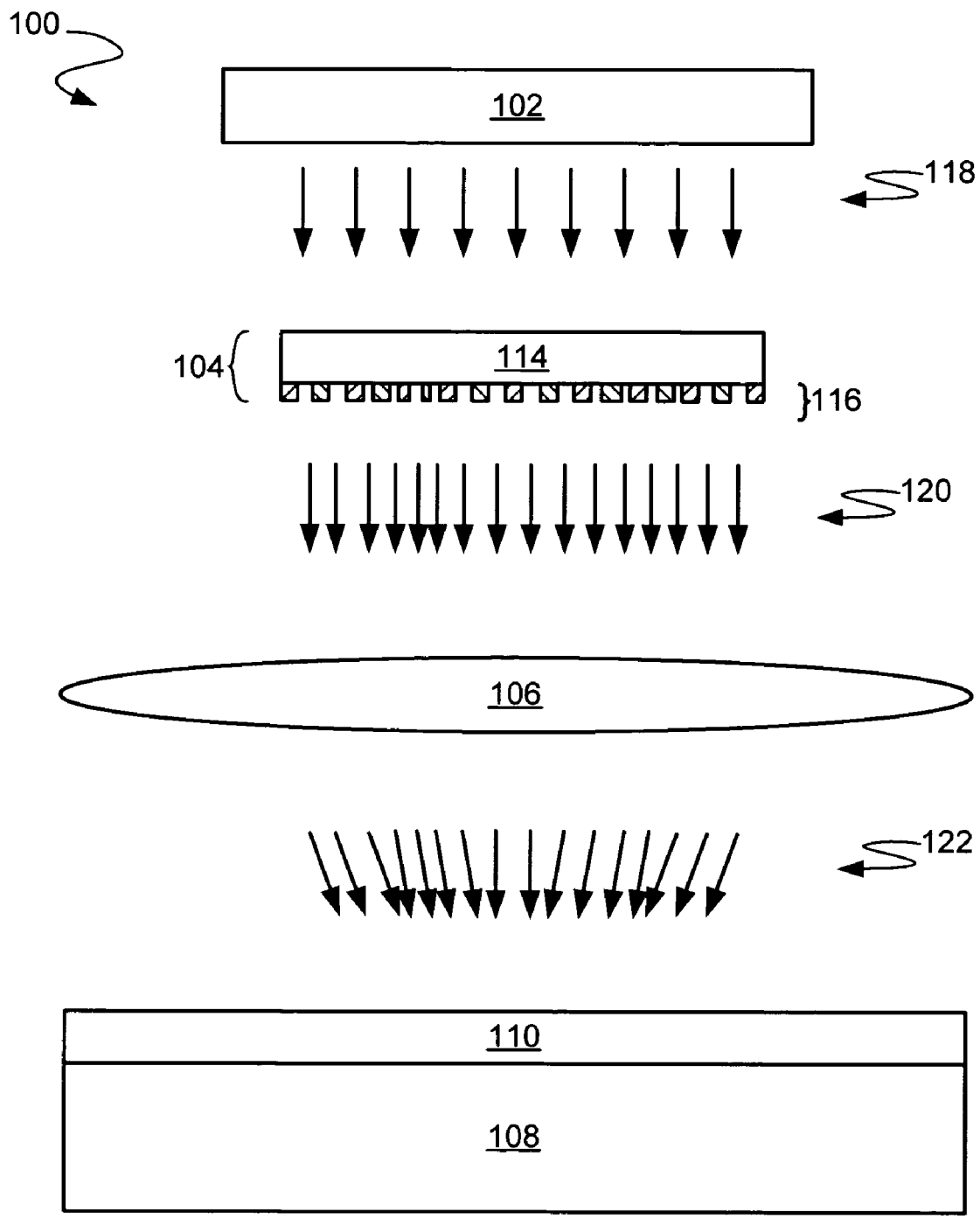
FIG. 1 (PRIOR ART) is a simplified schematic of a photolithographic system.

Referring now to FIG. 1 (PRIOR ART), therein is shown a simplified schematic of a photolithographic system 100. In the photolithographic system 100, radiation is directed from a radiation source 102 through a photomask 104 and a lens 106 onto a semiconductor wafer 108, on which will be formed a plurality of integrated circuits when completed. A photoresist layer 110 has been deposited on the semiconductor wafer 108.

The photomask 104 includes a light-transparent substrate 114, of a material such as fused silica or quartz, with a patterned mask coating 116.

The radiation source 102 can be a light that produces light 118 of a single wavelength, which the photomask 104 selectively allows through as patterned light 120 to be focused by the lens 106. Focused patterned light 122 reproduces the mask pattern of the patterned mask coating 116 on selected areas of the photoresist layer 110.

After exposure, the patterned photoresist layer 110 is used as a mask in a photolithographic process to form features or to implant regions on the semiconductor wafer 108 or on various layers of material previously deposited or grown on the semiconductor wafer 108. The goal in the photolithographic field is to keep reducing the size of such features and implant regions.

Unfortunately, in photolithographic systems, even a geometrically perfect lens cannot separate two points below a minimum distance. When the two points are less than this minimum distance from each other, they cannot be separated or "resolved". This is due to diffraction and interference effects. Diffraction effects, which are due to the wave nature of the light 118, cause peaks and valleys to occur in the intensity of the light 118 passing through an opening, such as an opening in the patterned mask coating 116, and falling on the photoresist layer 110 on the semiconductor wafer 108. Interference effects occur with side-by-side openings, where the peaks and valleys of the light waves can interfere so as to cancel each other out, or can reinforce and amplify each other, depending on the locations of the openings.

Depending upon how close two points are, the diffraction effect spreads the light from these two points across the imaging lens. If the two points are sufficiently close, the light will be diffracted out of the path of the lens. In this case, the points will be too close to each other and they will be under the limit of resolution of the system. The resolution of a non-perfect lens depends upon the wavelength of the light source and the numerical aperture ("NA") of the lens. Two images are considered as being resolvable when the intensity between them drops to 80 percent of the image intensity. Thus, two images are considered resolvable when the following equation is fulfilled:

$$2D = 0.6\lambda/NA$$

where: 2D is the separation of the two images;

$\lambda$ is the wavelength of the radiation source 102; and

NA is the numerical aperture of the lens 106.

Interference and diffraction effects can cause small distortions to occur during photolithography. These small distortions are caused by optical interference between elements of the mask design, optical diffraction, and resist process effects. Optical proximity correction ("OPC") corrects these small distortions.

OPC is a mask design enhancing procedure that corrects small distortions that occur during patterning. By applying modifications to compensate for the distortions, OPC produces slight shape changes in the semiconductor design. For example, if interference will cause a patterned line to be too short or too narrow, OPC will modify the designed line to be slightly longer or wider.

Engineers typically use computer aided design ("CAD") to create a schematic design of the mask. In order to predict the image the mask will create on a photoresist, computer simulations of photoresist patterning are run during the OPC process.

Figure 2:
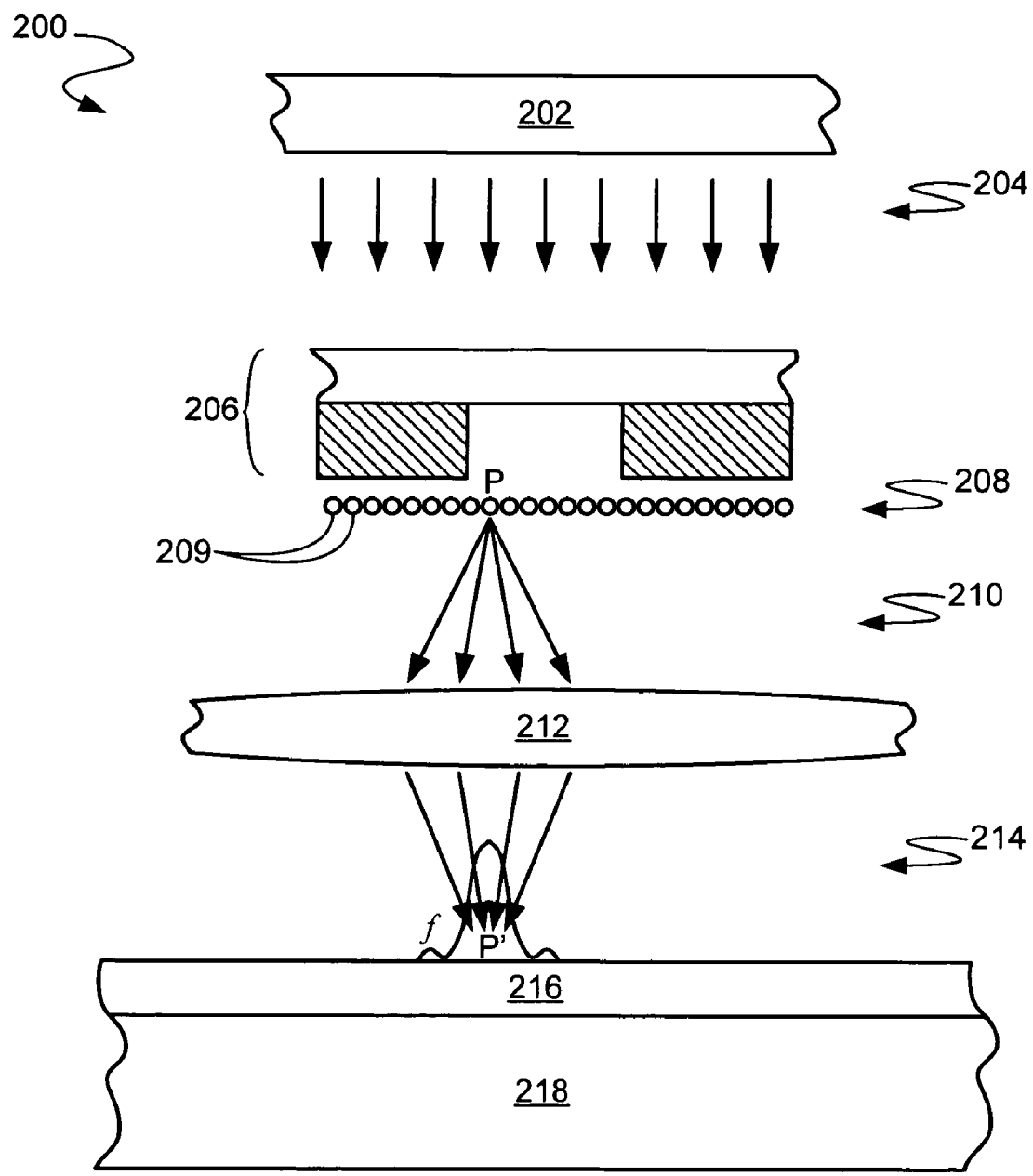
FIG. 2 (PRIOR ART) is a simplified figurative computer simulation of near field photoresist patterning, where the patterns of interest can generally be described in one dimension.

Referring now to FIG. 2 (PRIOR ART), therein is shown a simplified figurative computer simulation 200 of near field photoresist patterning, where the patterns of interest can generally be described in one dimension. A simulated radiation source 202 produces simulated light 204. The simulated light 204 is directed through a trial mask design 206 and a near field 208 is calculated.

The near field 208 is located just below the trial mask design 206 and is calculated by solving coupled Maxwell's equations:

$$\nabla \times \vec{H} = \frac{\partial \vec{D}}{\partial t} + \vec{J}$$

$$\nabla \times \vec{E} = -\frac{\partial \vec{B}}{\partial t}$$

Next, each point 209 in the near field 208 is treated as a radiation source, producing near field-originated light 210. The near field-originated light 210 is directed through a simulated lens 212. The simulated lens 212 focuses the near field-originated light 210, producing focused near field light 214. The focused near field light 214 is directed onto a simulated photoresist layer 216 on a simulated semiconductor wafer 218. Thus, a composite image intensity of the near field 208 on the simulated photoresist layer 216 is calculated by the equation:

$$U' = \sum_{\text{all } P \text{ in near field}} f_P$$

where $f$ is the function describing the light intensity from each respective point (P) in the near field at the wafer surface (P').

Engineers then examine the results of the simulation, make design adjustments, and run another simulation. Unfortunately, the simplified figurative computer simulation 200, involving near field calculations, takes a long time for even simple mask designs.

Thus, near field photoresist patterning will be understood to refer to the simplified computer simulation 200 including calculating the composite image intensity of the simulated semiconductor wafer 218 by first calculating the near field 208 beneath the trial mask design 206. It is not meant to imply using the near field 208 to pattern the simulated photoresist layer 216 by putting the simulated semiconductor wafer 218 in the near field 208.

Figure 3:
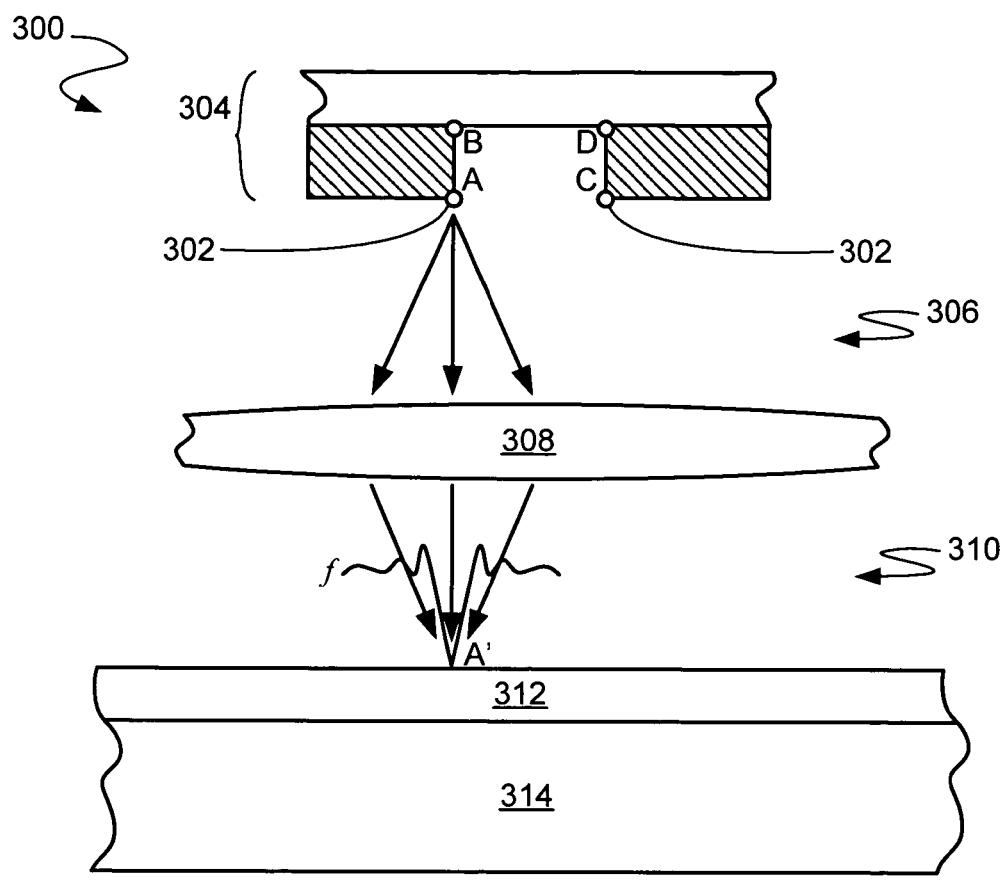
FIG. 3 is a simplified figurative computer simulation of non-near field photoresist patterning, where the patterns of interest can generally be described in one dimension, in accordance with an embodiment of the present invention.

Referring now to FIG. 3, therein is shown a simplified figurative computer simulation 300 of non-near field photoresist patterning, where the patterns of interest can generally be described in one dimension, in accordance with an embodiment of the present invention. The simplified figurative computer simulation 300 does not calculate the near field 208 (FIG. 2). Instead, as taught by the present invention, the mask simulation is achieved by treating each discontinuity point 302 (e.g., points A, B, C, and D) in a trial mask design 304 as a light source. Simulated discontinuity light 306 is then directed through a simulated lens 308, producing focused discontinuity light 310. The focused discontinuity light 310 is directed onto a simulated photoresist layer 312 on a simulated semiconductor wafer 314. Thus, a composite image intensity of the discontinuity points 302 on the simulated photoresist layer 312 is calculated by the equation:

$$U' = \sum_{P=A,B,C,D} f_p$$

where $f$ is the function describing the light intensity from each discontinuity point 302 at the wafer surface (e.g. A').

The composite image intensity is examined to verify a target composite image intensity. If the verification fails and the target composite image intensity does not match the composite image intensity, design adjustments are made and another simulation is run. However, this simulation, using only the discontinuity points 302, is much faster than simulations using near field calculations. In trial simulations, for example, one embodiment of the present invention was several orders of magnitude faster than simulations using near field calculations with substantially the same accuracy. This is a major and highly significant improvement over prior art near field photomask design technologies.

Figure 4A:
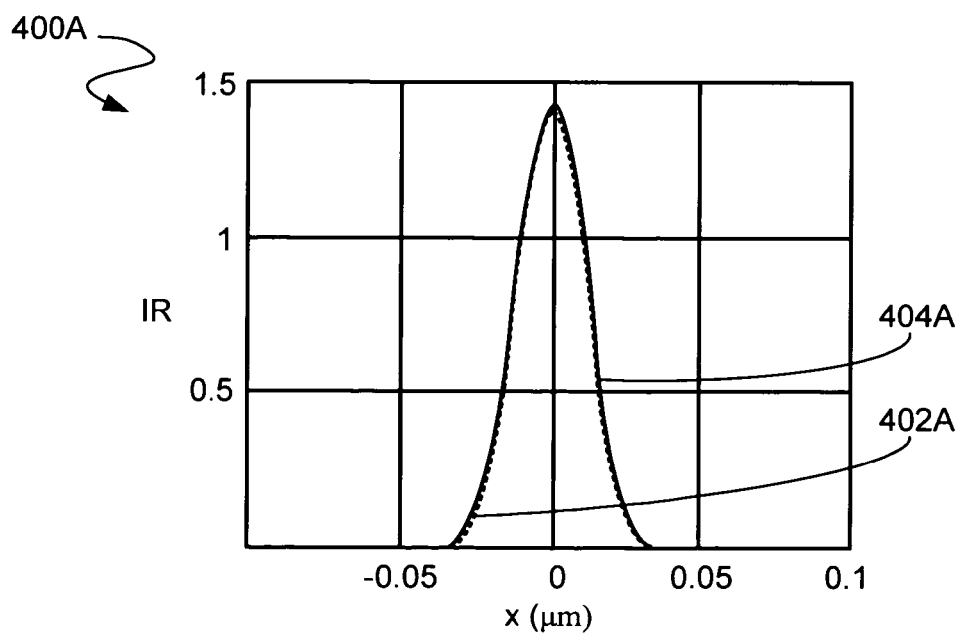
FIG. 4A is a graphical representation of transverse electric irradiance profiles corresponding to a trench in a mask.
Figure 4B:
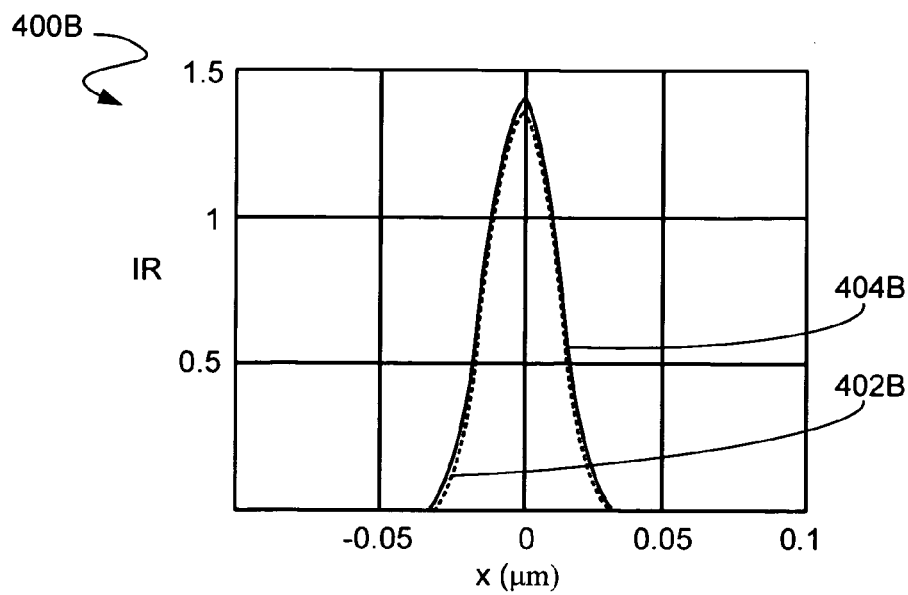
FIG. 4B is a graphical representation of transverse magnetic irradiance profiles corresponding to a trench in a mask.

Referring now to FIGS. 4A and 4B, therein are shown transverse electric ("TE") irradiance ("IR") profiles 400A and transverse magnetic ("TM") irradiance profiles 400B respectively, corresponding to a trench in a mask. The TE irradiance profiles 400A and TM irradiance profiles 400B were obtained using the following values: numerical aperture NA=0.25; partial coherence factor σ=0; trench width=0.045 μm; equivalent trench thickness=0.2 μm; and incident wavelength λ=0.013417 μm.

Tempest, a rigorous electromagnetic field simulator from the University of California at Berkeley using near field calculations, was used to calculate the TE irradiance profile 400A and the TM irradiance profile 400B, shown as respective a dashed curves 402A and 402B. The near field was calculated at 0.05 μm below the mask. The simulation period and grid interval used in the Tempest simulation were 1 μm and 0.0005 μm respectively. The time taken to compute a single near field profile was 30 minutes on a Pentium 800 MHz computer.

The present invention was then used to calculate the TE irradiance profile 400A and the TM irradiance profile 400B, shown as respective solid curves 404A and 404B. The time taken to compute both the TE irradiance profile 400A and the TM irradiance profile 400B was 6 seconds on a Pentium 266 MHz computer. Thus, the present invention is several orders of magnitude faster while producing virtually the same results as simulations using near field calculations.

Figure 5:
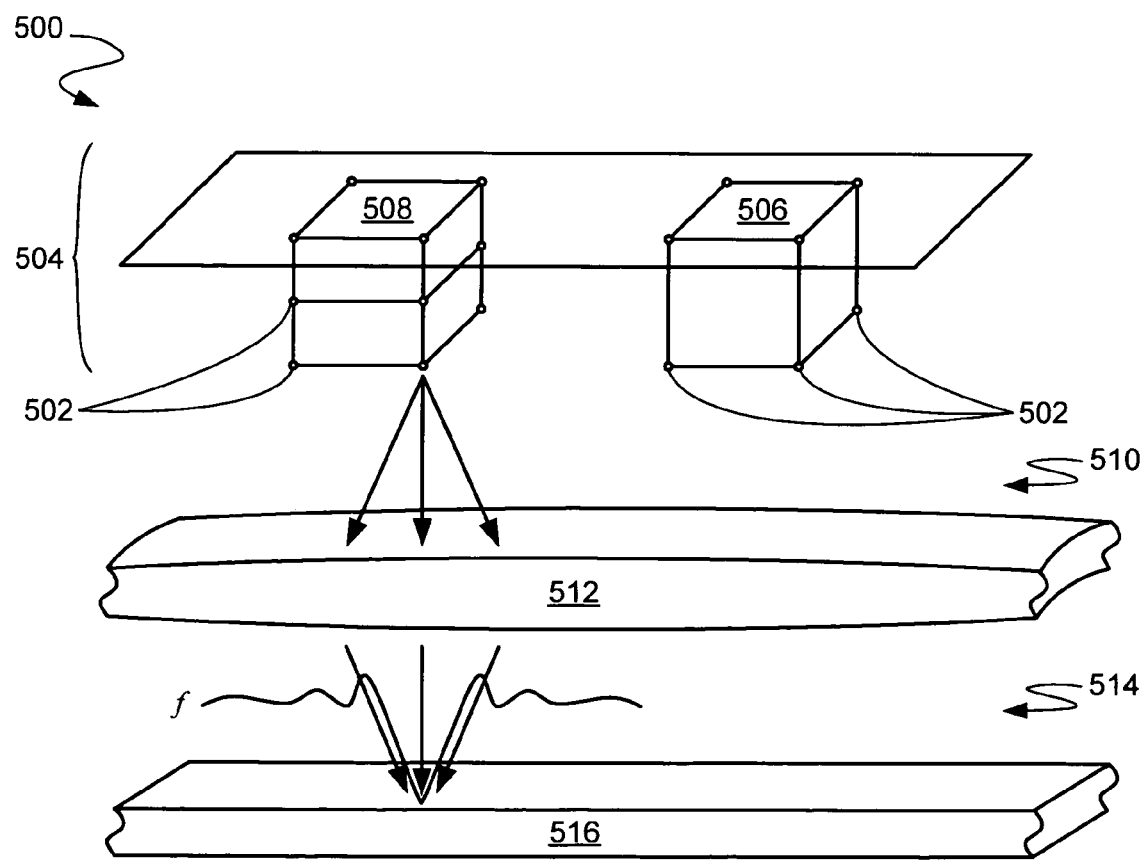
FIG. 5 is a simplified figurative simulation of 2D non-near field photoresist patterning, in accordance with an alternate embodiment of the present invention.

Referring now to FIG. 5, therein is shown a simplified figurative simulation 500 of non-near field photoresist patterning, where the patterns of interest can generally be described in two dimensions, in accordance with an alternate embodiment of the present invention. Each discontinuity point 502 in a trial mask design 504 is treated as a light source. The trial mask design may have homogeneous features 506 composed of a single material, or heterogeneous features 508 composed of multiple materials. Simulated discontinuity light 510 is directed through a simulated lens 512, producing focused discontinuity light 514. The focused discontinuity light 514 is directed onto a simulated photoresist layer 516. Thus, a composite image intensity of the discontinuity points 502 on the simulated photoresist layer 516 is calculated by the equation:

$$U' = \sum_{All\,discontinuity\,points} f_p$$

where $f$ is the function describing the light intensity from each discontinuity point 502 at the wafer surface.

The composite image intensity is examined to verify a target composite image intensity. If the verification fails and the target composite image intensity does not match the composite image intensity, design adjustments are made and another simulation is run. However, this simulation is much faster than simulations using near field calculations.

After engineers have completed design adjustments and simulations in the OPC process, a penultimate mask design then undergoes sharpening in the OPC process.

However, sharpening relies on proper fragmenting of the mask design. If the fragmenting is incorrect, the final mask design will be under-corrected or over-corrected. If this occurs, the OPC process must be run again and new fragmenting applied to the mask design.

Figure 6:
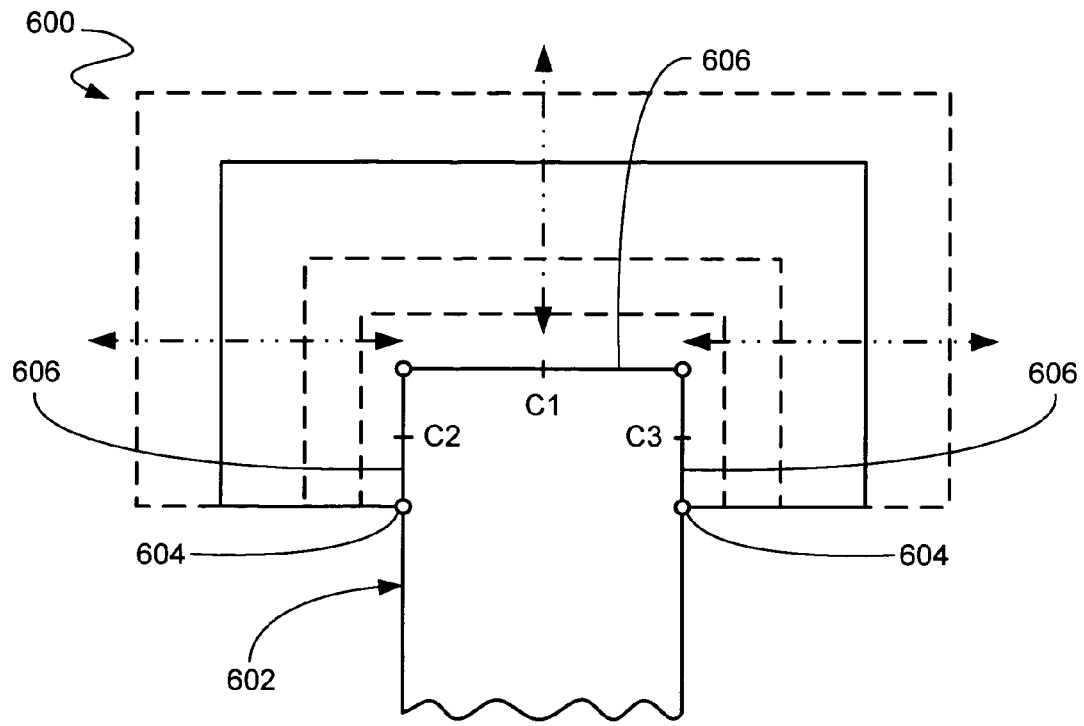
FIG. 6 (PRIOR ART) is a conventional illustration of existing optical proximity correction methodology.

Referring now to FIG. 6 (PRIOR ART), therein is shown a simplified illustration 600 of an example of existing OPC methodology. Current OPC methodology involves breaking a mask outline 602 at fragmented points 604 into edge fragments 606. The edge fragments 606 are then each displaced repeatedly in directions perpendicular to the respective edge fragments 606. Thus, the solution obtained is dependent upon the positions of the fragmented points 604.

To arrive at the solution, a cost function equal to the summation of edge placement error ("EPE"), defined as equal to the difference between the desired and the actual position of the printed pattern profile, calculated at fragment sites C1, C2, and C3, is defined as:

$$c = \Sigma_i |EPE_i|$$

Each edge fragment 606 is then moved to a respective position where its contribution to the cost function is a minimum. The position of each edge fragment 606 is then updated until the cost function stabilizes.

The final printed pattern obtained depends on how the mask outline is fragmented. Therefore, it is possible for the printed pattern to be under-corrected or over-corrected. When this occurs, new fragmented points 604 must be selected and the calculations run again.

Figure 7:
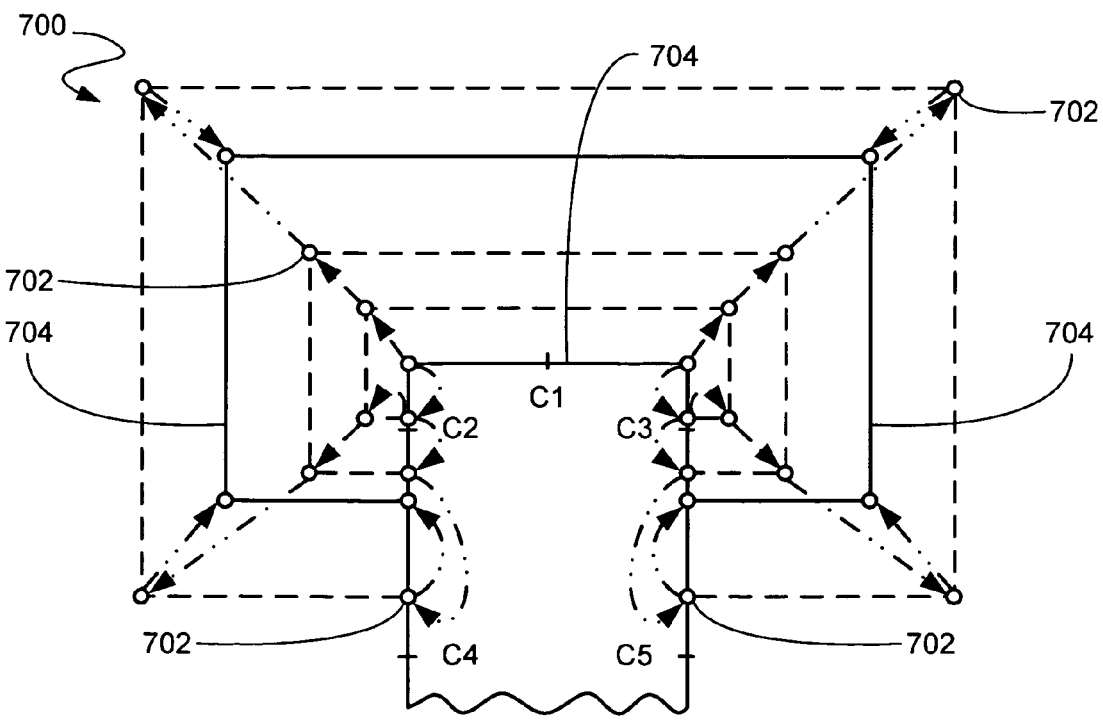
FIG. 7 is a simplified illustration of vertex optical proximity correction, in accordance with an embodiment of the present invention.

Referring now to FIG. 7, therein is shown a simplified illustration 700 of vertex OPC, in accordance with an embodiment of the present invention. Vertex OPC displaces mask vertices 702 instead of edge fragments 606 (FIG. 6 (PRIOR ART)). Thus, the lengths of the edge fragments 704 become variable, and the mask vertices 702 are displaced repeatedly, in both x and y directions, until correct displacements are obtained.

To obtain the correct displacements, irradiance constraints are defined such that the EPE at the points of concern C1, C2, C3, C4 and C5 is zero. The required displacements of the mask vertices 702, satisfying the irradiance constraints, are calculated algebraically from a system of linear equations. In order to solve the system of linear equations, the number of constraints must be equal to the number of independent variables. In general, the constraints can be in any form. For example, the constraint could be defined as: let the slope of the irradiance profile at C1 equal 0.8. The position of each edge fragment 704 is then updated until irradiance constraints are satisfied.

Optimum displacements are determined using vertex diffraction edge response ("VDER"). VDER is derived by combining concepts contained in the geometrical theory of diffraction ("GTD") and Hopkins' theory of image formation. Using VDER, the intensity at a target position t can be written as a function of the vertex positions:

$$I'(r') = \Sigma_k | VDER_k(r', r'_1) + VDER_k(r', r'_2) + \ldots + VDER_K(R', R'_2) + \ldots + VDER_K(R', R'_2)|^2$$

When one of the vertices, $r_b$, is displaced about its original position, the new intensity at target t can be written as:

$$I'(r') + \Delta I'(r') = \Sigma_k |U_k + \Delta U_k|^2$$

where $U_k = \Sigma_b VDER_b$

Assuming $U_k \gg \Delta U_k$, then, ignoring higher order terms, the intensity change $\Delta I'$ can be expressed as:

$$\Delta I'(r') = \Sigma_k 2 U_k \Delta U_k$$

If the vertex displacement is small, $$\Delta U_k \sim \nabla VDER_k(r', r'_b) \cdot \Delta r_b$$

If all the break points are displaced, $$\Delta U_k = \Sigma_b \nabla VDER_k(r', r'_b) \cdot \Delta r_b$$

The intensity change is then given by:

$$\Delta I'(r') = \Sigma_b \Sigma_k 2 U_k \nabla VDER_k(r', r'_b) \cdot \Delta r_b$$

$$= \Sigma_b A_b \Delta x_b + B_b \Delta y_b$$

where $$A_b = \sum_k 2 U_k \frac{\partial VDER_k(r', r'_b)}{\partial x}$$

$$B_b = \sum_k 2 U_k \frac{\partial VDER_k(r', r'_b)}{\partial y}$$

Given a total of N vertices, and assuming the vertices are displaced in such a way that the displaced vertices still form a Manhattan polygon when they are rejoined, there are only N independent displacement variables. A "Manhattan polygon" is a convex polygon whose (nonempty set of) vertices lie on the integer lattice, and whose (possibly empty set of) edges each have a slope of $\{0, 1, -1, \infty\}$. They are exactly integral bisubmodular polyhedra of dimension two. Therefore, to solve for the required vertex displacements, N such equations are needed.

Casting the system of equations in matrix formalism:

$$\begin{pmatrix} A_{11} & B_{11} & \cdots & A_{1N} & B_{1N} \\ \vdots & & & & \vdots \\ \cdot & & \cdot & & \cdot \\ \vdots & & & & \vdots \\ A_{N1} & B_{N1} & \cdots & A_{NN} & B_{NN} \end{pmatrix} \begin{pmatrix} \Delta x_1 \\ \Delta y_1 \\ \vdots \\ \Delta x_N \\ \Delta y_N \end{pmatrix} = \begin{pmatrix} \Delta I_1 \\ \Delta I_2 \\ \vdots \\ \vdots \\ \Delta I_N \end{pmatrix}$$

If the resist prints at a constant intensity threshold, then the required intensity change giving zero edge placement error is known. The required vertex displacements can then be solved.

In the vertex based OPC methodology, the final printed pattern is not dependent on where the mask outline 602 (FIG. 6(PRIOR ART)) is initially broken and there are greater degrees of freedom for correction. Thus, the problem of under-correction or over-correction is avoided, saving time and resources.

Figure 8:
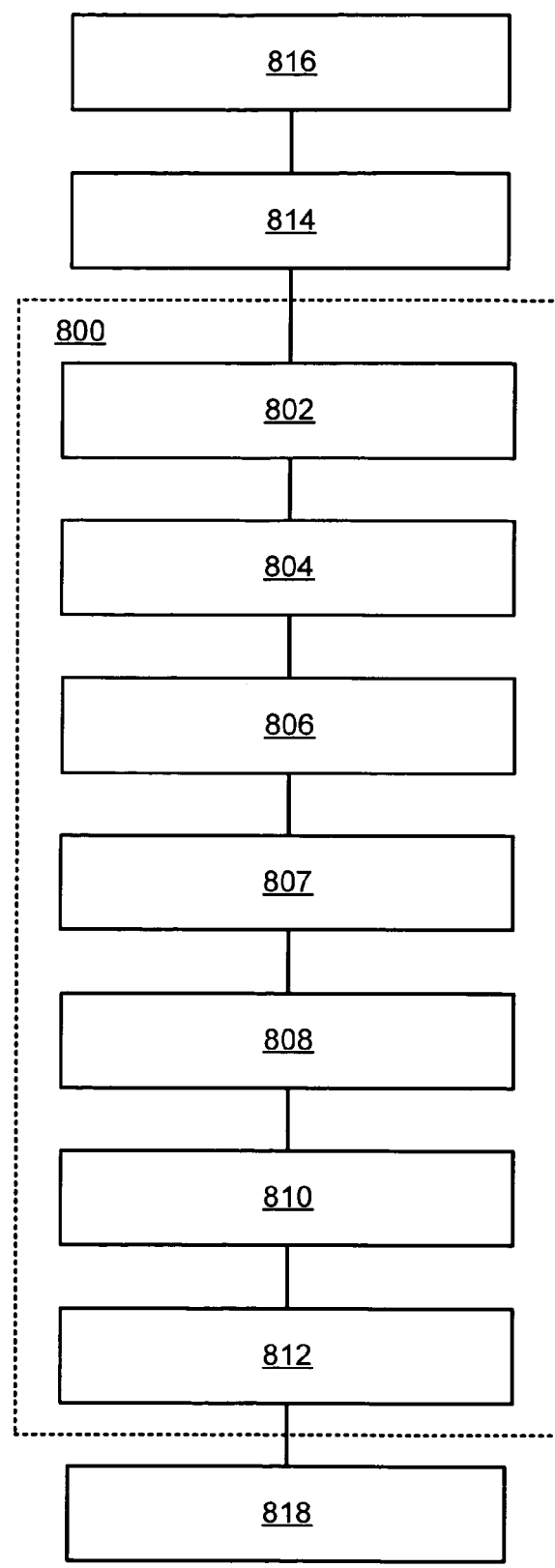
FIG. 8 is a block diagram of a system for designing semiconductor photomasks according to an embodiment of the present invention.

Referring now to FIG. 8, therein is shown a block diagram of a system for designing semiconductor photomasks 800 according to an embodiment of the present invention. The system for designing semiconductor photomasks 800 is the result of the discovery that at times a single fundamental block can solve the problems presented but often there are seven fundamental blocks to solving the problems presented.

The seven fundamental blocks are a treating block 802, a focusing block 804, a calculating block 806, a comparing block 807, an adjustment block 808, a repeating block 810, and a sharpening block 812. Each of the blocks can stand independently in the system for designing semiconductor photomasks 800, and within these blocks may be included various commercially available techniques, methodologies, processes, and approaches as well as the invention disclosed herein. The six fundamental blocks are discussed in the approximate chronology that the blocks are used in the system for designing semiconductor photomasks 800.

The system for designing semiconductor photomasks 800 includes various elements of commercially available production, design, and development semiconductor equipment and circuitry, which operate on and manipulate information and/or data, which are generically defined herein as "information". The system for designing semiconductor photomasks 800 receives information from a device 814, such as a semiconductor photomask design system. The device 814 generates a trial semiconductor photomask design 816, having discontinuity points and/or mask vertices. The system for designing semiconductor photomasks 800 provides a photomask design specification to a photomask manufacturing system 818 for storing, printing, or fabricating such a photomask.

The trial semiconductor photomask design 816 can be anything from a full semiconductor chip pattern down to features and phase regions of an individual semiconductor device on a die. The photomask manufacturing system 818 can be any technique, method, process, or approach for the production of one or more photomasks.

In the treating block 802, each of the discontinuity points is treated as a simulated light source.

Next, in the focusing block 804, a simulated lens focuses simulated light from the simulated light sources onto a simulated photoresist layer.

In the calculating block 806, a composite image intensity of the focused simulated light on the simulated photoresist layer is calculated algebraically to create a penultimate semiconductor photomask design.

In the comparing block 807, the composite image intensity, calculated in the calculating block 806, is compared to a target composite image intensity. Thus, the composite image intensity is examined to verify a target composite image intensity.

In the adjustment block 808, adjustments are made to the trial semiconductor photomask design 816 in response to the circuitry for comparing.

In the repeating block 810, the treating block 802, the focusing block 804, the calculating block 806, the comparing block 807, and the adjustment block 808 are repeated until a target composite image intensity is achieved.

Finally, in the sharpening block 812, the penultimate semiconductor photomask design is sharpened by moving the discontinuity points and/or mask vertices in x and y directions. The sharpening generates the photomask design specification.

Figure 9:
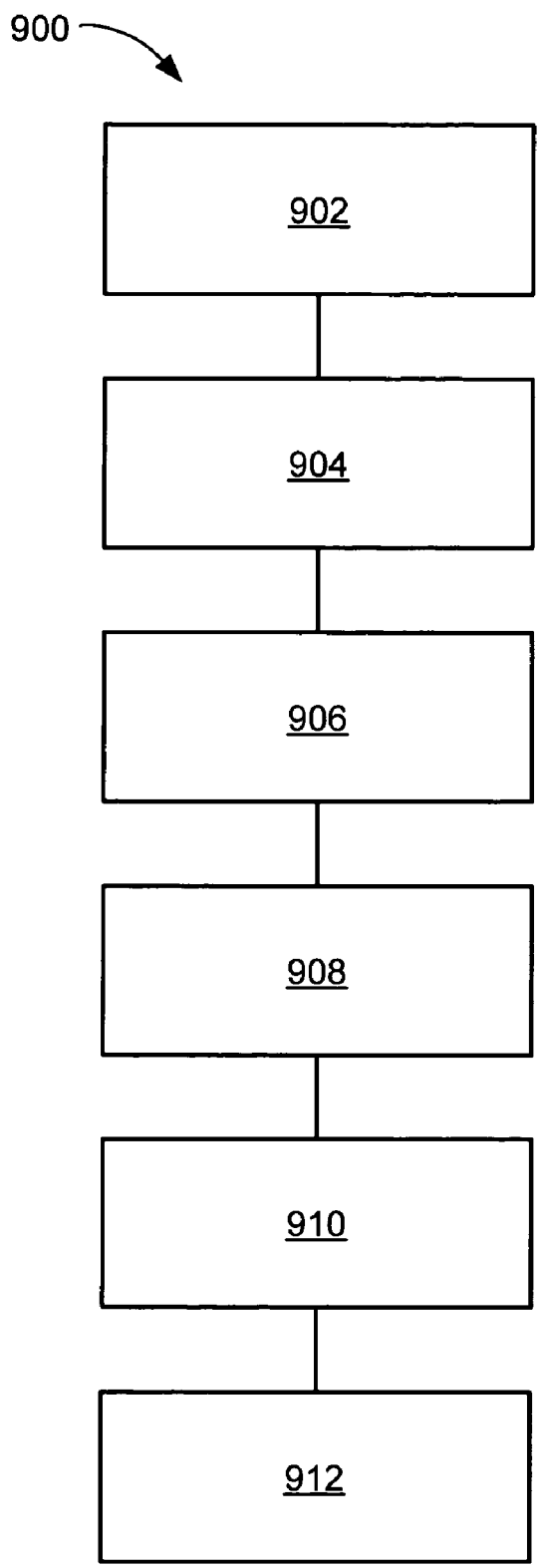
FIG. 9 is a flow chart of a method for designing semiconductor photomasks in accordance with an embodiment of the present invention.

Referring now to FIG. 9, therein is shown a flow chart of a method 900 for designing semiconductor photomasks in accordance with an embodiment of the present invention. The method 900 includes providing a trial semiconductor photomask design having discontinuity points in a block 902; treating each of the discontinuity points as simulated light sources in a block 904; focusing simulated light from each of the simulated light sources in a block 906; calculating a composite image intensity of the focused simulated light to verify the trial semiconductor photomask design in a block 908; sharpening the semiconductor photomask design in a block 910; and generating a photomask design specification for use in fabricating such a photomask in a block 912.

Thus, it has been discovered that the photomask designing method and apparatus of the present invention furnish important and heretofore unknown and unavailable solutions, capabilities, and functional advantages for designing photomasks. The resulting processes and configurations are straightforward, economical, uncomplicated, highly versatile, accurate, sensitive, and effective, and can be implemented by adapting known components for ready manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method for designing semiconductor photomasks comprising:
providing a trial semiconductor photomask design having discontinuity points;
treating each of the discontinuity points as simulated light sources;
focusing simulated light from each of the simulated light sources;
calculating a composite image intensity of the focused simulated light to verify the trial semiconductor photomask design;
sharpening the trial semiconductor photomask design; and
generating a photomask design specification for use in fabricating such a photomask.

2. The method of claim 1 wherein:
providing a trial semiconductor photomask design having discontinuity points; and
sharpening the trial semiconductor photomask design;
further comprises:
providing a trial semiconductor photomask design having mask vertices; and
sharpening the trial semiconductor photomask design by moving the mask vertices.

3. The method of claim 1 wherein providing a trial semiconductor photomask design having discontinuity points further comprises providing a trial semiconductor photomask design having a pattern described in at least two dimensions.

4. The method of claim 1 wherein calculating a composite image intensity of the focused simulated light further comprises calculating a composite image intensity of the focused simulated light to create a penultimate semiconductor photomask design.

5. The method of claim 1 wherein sharpening the trial semiconductor photomask design further comprises sharpening the trial semiconductor photomask design using vertex diffraction edge response.

6. A method for designing semiconductor photomasks comprising:
providing a trial semiconductor photomask design having discontinuity points;
treating each of the discontinuity points as simulated light sources;
focusing simulated light from each of the simulated light sources with a simulated lens onto a simulated photoresist layer;
calculating a composite image intensity of the focused simulated light on the simulated photoresist layer;
comparing the composite image intensity to a target composite image intensity;
making adjustments to the trial semiconductor photomask design in response to the comparing;
repeating treating, focusing, calculating, comparing, and making adjustments until the target composite image intensity is achieved;
sharpening the trial semiconductor photomask design; and
generating a photomask design specification for use in fabricating such a photomask.

7. The method of claim 6 wherein:
providing a trial semiconductor photomask design having discontinuity points; and
sharpening the trial semiconductor photomask design;
further comprises:
providing a trial semiconductor photomask design having mask vertices; and
sharpening the trial semiconductor photomask design by moving the mask vertices in x and y directions.

8. The method of claim 6 wherein providing a trial semiconductor photomask design having discontinuity points further comprises providing a trial semiconductor photomask design having a pattern described in at least two dimensions.

9. The method of claim 6 wherein:
calculating a composite image intensity of the focused simulated light on the simulated photoresist layer; and
sharpening the trial semiconductor photomask design;
further comprises;
calculating a composite image intensity of the focused simulated light on the simulated photoresist layer to create a penultimate semiconductor photomask design, and
sharpening the penultimate semiconductor photomask design.

10. The method of claim 6 wherein sharpening the trial semiconductor photomask design further comprises applying optical proximity correction to the trial semiconductor photomask design using vertex diffraction edge response.

11. A system for designing semiconductor photomasks comprising:
a trial semiconductor photomask design with discontinuity points;
circuitry for treating each of the discontinuity points as simulated light sources;
circuitry for focusing simulated light from each of the simulated light sources;
circuitry for calculating a composite image intensity of the focused simulated light to verify the trial semiconductor photomask design;
circuitry for sharpening the semiconductor photomask design; and
circuitry for generating a photomask design specification for use in fabricating such a photomask.

12. The system of claim 11 wherein:
the trial semiconductor photomask design with discontinuity points; and
the circuitry for sharpening the trial semiconductor photomask design;
further comprise:
a trial semiconductor photomask design having mask vertices; and
circuitry for sharpening the trial semiconductor photomask design by moving the mask vertices.

13. The system of claim 11 wherein the trial semiconductor photomask design with discontinuity points further comprises a trial semiconductor photomask design having a pattern described in at least two dimensions.

14. The system of claim 11 wherein the circuitry for calculating a composite image intensity of the focused simulated light further comprises circuitry for calculating a composite image intensity of the focused simulated light to create a penultimate semiconductor photomask design.

15. The system of claim 11 wherein the circuitry for sharpening the trial semiconductor photomask design further comprises circuitry for sharpening the trial semiconductor photomask design using vertex diffraction edge response.

16. A system for designing semiconductor photomasks comprising:
a trial semiconductor photomask design having discontinuity points;
circuitry for treating each of the discontinuity points as simulated light sources;
circuitry for focusing simulated light from each of the simulated light sources with a simulated lens onto a simulated photoresist layer;
circuitry for calculating a composite image intensity of the focused simulated light on the simulated photoresist layer;
circuitry for comparing the composite image intensity to a target composite image intensity;
circuitry for making adjustments to the trial semiconductor photomask design in response to the circuitry for comparing;
circuitry for repeating repeats the circuitry for treating, the circuitry for focusing, the circuitry for calculating, the circuitry for comparing, and the circuitry for making adjustments, until the target composite image intensity is achieved;
circuitry for sharpening the trial semiconductor photomask design; and
circuitry for generating a photomask design specification for use in fabricating such a photomask.

17. The system of claim 16 wherein:
the trial semiconductor photomask design with discontinuity points; and
the circuitry for sharpening the trial semiconductor photomask design;
further comprises:
a trial semiconductor photomask design having mask vertices; and
circuitry for sharpening the trial semiconductor photomask design by moving the mask vertices in x and y directions.

18. The system of claim 16 wherein the trial semiconductor photomask design with discontinuity points further comprises a trial semiconductor photomask design having a pattern described in at least two dimensions.

19. The system of claim 16 wherein:
the circuitry for calculating the composite image intensity of the focused simulated light on the simulated photoresist layer; and
the circuitry for sharpening the trial semiconductor photomask design;
further comprises:
circuitry for calculating a composite image intensity of the focused simulated light on the simulated photoresist layer to create a penultimate semiconductor photomask design; and
circuitry for sharpening the penultimate semiconductor photomask design.

20. The system of claim 16 wherein the circuitry for sharpening the trial semiconductor photomask design further comprises circuitry for sharpening the trial semiconductor photomask design using vertex diffraction edge response.

* * * * *